United States Patent
Haller et al.

(10) Patent No.: US 9,058,456 B2
(45) Date of Patent: Jun. 16, 2015

(54) METHOD AND SYSTEM TO FIX EARLY MODE SLACKS IN A CIRCUIT DESIGN

(71) Applicant: INTERNATIONAL BUSINESS MACHINES CORPORATION, Armonk, NY (US)

(72) Inventors: Wilhelm Haller, Boeblingen (DE); Ulrich Krauch, Boeblingen (DE); Kurt Lind, Boeblingen (DE); Alexander Woerner, Boebingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/035,125

(22) Filed: Sep. 24, 2013

(65) Prior Publication Data

US 2014/0089880 A1    Mar. 27, 2014

(30) Foreign Application Priority Data

Sep. 25, 2012 (DE) ..................................... 1217030
Aug. 23, 2013 (DE) ..................................... 1315088

(51) Int. Cl.
G06F 17/50        (2006.01)

(52) U.S. Cl.
CPC ........ G06F 17/5068 (2013.01); G06F 17/5036 (2013.01); G06F 17/5031 (2013.01); G06F 17/505 (2013.01); G06F 17/5077 (2013.01)

(58) Field of Classification Search
CPC ............ G06F 17/5031; G06F 17/5036; G06F 17/505; G06F 17/5068
USPC ......... 716/104, 105, 108, 113, 114, 123, 125, 716/128, 132, 134
See application file for complete search history.

(56) References Cited

U.S. PATENT DOCUMENTS 6,415,426 B1 *    7/2002    Chang et al. ................... 716/113
6,701,505 B1 *    3/2004    Srinivasan ..................... 716/114

(Continued)

FOREIGN PATENT DOCUMENTS

GB    2506179 A    3/2014
GB    2506275 B    8/2014

(Continued)

OTHER PUBLICATIONS

Sutanthavibul S, Shragowitz E, "An adaptive timing driven layout for high speed VLSI", Processing of the ACM/IEEE design automation conference, olranso, Jun. 24-28, 1990, col. conf. 27 pp. 90-95, ISBN: 978-0-89791-363-8.

(Continued)

*Primary Examiner* — Helen Rossoshek
(74) *Attorney, Agent, or Firm* — Patricia B. Feighan; Kenneth R. Corsello

(57) ABSTRACT

An improved method for fixing an early mode slack in a hierarchically designed hardware device with at least one source macro, an integration unit and at least one sink macro comprises: Loading hardware design timing data to determine pins where an early mode slack fix can be applied to fix an early mode slack; for each such pin determining a location across the design hierarchy for the early mode slack fix by calculating a weight value for each of a selection of fix locations of the early mode slack based on absolute values of arrival times of data signals, ratio and difference between arrival times of late mode data signals and early mode data signals; and assigning the early mode slack fix to the determined location based on said weight value.

14 Claims, 9 Drawing Sheets

(56) References Cited

U.S. PATENT DOCUMENTS

| | | | |
|---|---|---|---|
| 6,836,753 B1 * | 12/2004 | Silve ........................ 703/2 |
| 7,251,803 B2 * | 7/2007 | Suaris et al. .............. 716/104 |
| 7,278,126 B2 | 10/2007 | Sun et al. |
| 7,392,494 B2 * | 6/2008 | Lin et al. ................... 716/124 |
| 7,404,163 B2 * | 7/2008 | Chadwick et al. ......... 716/113 |
| 7,428,716 B2 * | 9/2008 | Visweswariah ............ 716/113 |
| 7,716,622 B2 * | 5/2010 | Suaris et al. .............. 716/128 |
| 7,752,578 B2 * | 7/2010 | Allen et al. ................ 716/123 |
| 7,844,933 B2 * | 11/2010 | Frank et al. ............... 716/123 |
| 7,853,915 B2 * | 12/2010 | Saxena et al. ............. 716/129 |
| 7,865,855 B2 * | 1/2011 | Koehl et al. ............... 716/113 |
| 7,937,604 B2 * | 5/2011 | Banerji et al. ............. 713/401 |
| 7,987,440 B2 * | 7/2011 | Kalafala et al. ........... 716/108 |
| 8,010,921 B2 * | 8/2011 | Visweswariah ............ 716/113 |
| 8,015,526 B2 * | 9/2011 | Chadwick et al. ......... 716/108 |
| 8,205,182 B1 * | 6/2012 | Zlatanovici et al. ....... 716/125 |
| 8,255,851 B1 | 8/2012 | Baransy et al. |
| 8,336,012 B2 * | 12/2012 | Fry et al. ................... 716/113 |
| 8,347,250 B2 * | 1/2013 | Gonzalez et al. .......... 716/114 |
| 8,516,417 B2 * | 8/2013 | Gaugler et al. ............ 716/105 |
| 8,689,158 B2 * | 4/2014 | Kalafala et al. ........... 716/113 |
| 8,701,059 B2 * | 4/2014 | Gaugler et al. ............ 716/105 |
| 2009/0064068 A1 * | 3/2009 | Ng et al. ..................... 716/6 |
| 2010/0268522 A1 * | 10/2010 | Bhanji et al. ............... 703/21 |
| 2012/0167030 A1 | 6/2012 | Gonzalez et al. |
| 2013/0239075 A1 * | 9/2013 | Gaugler et al. ............ 716/105 |

FOREIGN PATENT DOCUMENTS

| | | | | |
|---|---|---|---|---|
| JP | 2003022293 A | * | 1/2003 | ............ G06F 17/50 |
| WO | 2011/097460 | | 8/2011 | |

OTHER PUBLICATIONS

Search Report, United Kingdom Intellectual Property Office, Dec. 3, 2013. Application No. GB1315088.3.

* cited by examiner

METHOD AND SYSTEM TO FIX EARLY MODE SLACKS IN A CIRCUIT DESIGN

CROSS REFERENCE TO RELATED APPLICATION

This application claims priority under 35 U.S.C. §119 from Application No. 1217030.4 filed in the United Kingdom on Sep. 25, 2012, now abandoned, and Application No. 1315088.3 filed in the United Kingdom on Aug. 23, 2013, the entire contents of which are incorporated herein by reference.

FIELD OF THE INVENTION

The present invention relates to the field of hierarchically designed hardware devices, and more specifically to a method and system for fixing an early mode slack in a hierarchically designed hardware device design structure. Still more specifically, the present invention relates to a data processing program and a computer program product for fixing an early mode slack in a hierarchically designed hardware device.

DESCRIPTION OF THE RELATED ART

When developing clocked circuits like microprocessors, one of the development goals is avoiding early mode problems. This means that fast hardware can lead to signals arriving at the latch before the clock is in the right phase and thus a latch captures the data for the wrong clock cycle. If the signal arrives the latch before the clock is in the right phase to store it, this is considered as negative early mode slack and this problem has to be solved.

For larger designs that have aggressive timing goals like CPUs, a hierarchical design is often used to divide the design into handy pieces like macros, units, cores and the whole chip. But this is adding complexity to the early mode timing analysis. Since a timing path can cross the border of these pieces, it has to be determined which of these pieces is the right location to fix the early mode negative slack problem. This is important, since usually different people are responsible to fix the early mode slack, depending on whether the source macro, the integrating unit/core/chip wiring level, or the sink macro needs to be modified.

When analyzing the timing report in order to find out whether the designed hardware fits into the clock cycle, the end point report is the best choice. But for hierarchically designed hardware devices the timing report ends at the border of these pieces and the other hierarchy components are abstracted using timing assertions.

This abstraction makes timing analysis cumbersome, due to either missing completeness for the lower hierarchy level, or missing details in the higher abstraction level. End point reports for the lower hierarchy level (called macros) end at the abstraction border and thus become outdated together with the border values, which may change due to changes in other parts of the design. End point reports for the upper hierarchy level (called unit) offer correct and up-to-date timing results, but they do not reveal the design details of the lower hierarchy level, which also hides the root cause for bad timing data.

Also, the timing abstract assertions are created based on a previous timing run and thus do not reflect present reality, but the past. Timing data for the lower hierarchy level is based on these assertions and thus this timing data has the same deviations from present reality like the assertions it is based upon.

Current approaches can determine whether the early mode slack can be fixed on the integration level, or must be fixed inside the macros. These approaches use to evaluate the ratio between the early mode slack that needs to be fixed, and the late mode (positive) slack that can be "consumed" by this fix, without introducing a late mode slack problem. A late mode slack problem is considered if the signal arrives too late to be stored by the latch in this clock cycle. If the ratio between the early mode slack to reduce, and the late mode slack available to consume, is better than 2.5 to 3, it can be fixed by integration means. Advanced methods can also recommend which delay devices to use on integration level to fix the early mode slack.

But there is no automated method known yet to determine if the early mode slack must be fixed in the source or sink macro, when it cannot be fixed on integration level without introducing late mode slack problems. In this case both macros used to be inspected manually to determine where the early mode slack can be fixed. Such a manual inspection is cumbersome, since large amounts of data that are spread over multiple files need to be analyzed.

In the Patent Application Publication US 2010/0191774 A1 by Sun et al., a method and an apparatus for fixing hold time violations in a circuit design "METHOD AND APPARATUS FOR FIXING HOLD TIME VIOLATIONS IN A CIRCUIT DESIGN" are disclosed. According to the disclosed method, to fix hold time violations, timing analysis is initially performed on a circuit design for each set of timing constraints to determine a setup slack and a hold slack for each signal path for that set of timing constraints. The slack for a signal path indicates the amount of timing margin or the amount of timing violation for that signal path. Signal paths with hold time violations (or "hold paths") are identified and retained, and other signal paths without hold time violations are discarded. For each hold path, signal paths with at least one node in common with the hold path (or "related setup paths") are identified and retained. Related setup paths with large setup slacks may be pruned. Then the hold time violations for the hold paths are fixed based on the hold slacks for the hold paths and the setup slacks for the related setup paths. According to the disclosed method, early mode hold problems are fixed within a circuit that has a flat design approach. A method to determine the right place (source macro, unit integration, or sink macro) to fix an early mode hold problem in a hierarchical design is not described.

SUMMARY OF THE INVENTION

The technical problem underlying the present invention is to provide a method and a system for fixing an early mode slack in a hierarchically designed hardware device to automatically determine the location where the early mode slack can be fixed with reduced effort while avoiding the above mentioned shortcomings and pain points of prior art fixing early mode slacks.

According to the present invention this problem is solved by providing a method for fixing an early mode slack in a hierarchically designed hardware device having the features of claim 1, a system for fixing an early mode slack in a hierarchically designed hardware device having the features of claim 16. Advantageous embodiments of the present invention are mentioned in the subclaims.

Accordingly, in an embodiment of the present invention a method for fixing an early mode slack in a hierarchically designed hardware device with at least one source macro, an integration unit and at least one sink macro comprises loading hardware design timing data to determine pins where an early mode slack fix is applicable to an early mode slack; for each such pin determining a location across the design hierarchy for the early mode slack fix by calculating a weight value for each of a selection of fix locations of the early mode slack based on absolute values of arrival times of data signals, ratio and difference between arrival times of late mode data signals and early mode data signals; and assigning the early mode slack fix to the determined location based on the weight value.

In a further embodiment of the present invention, the hardware design timing data is filtered to determine sink macro input pins for analyzing using at least one of the following information: pin owner, pin type, buffer usage, and timing phase information.

In a further embodiment of the present invention, an early mode slack threshold value is used to determine sink macro input pins to be fixed resulting in a list of problem pins.

In a further embodiment of the present invention, based on the list of problem pins early mode timing paths are analyzed to create several main categories of assignments for the early mode slack fixes.

In a further embodiment of the present invention, a first category of assignments is selected to comprise critical pins to be fixed in the source macro or in the sink macro, a second category of assignments is selected to comprise paddable pins to be fixed on integration unit level by adding delay devices or buffers, and a third category of assignments is selected to comprise fixable pins to be fixed on integration unit level by modifying delay devices or buffers in the source macro or in the sink macro.

In a further embodiment of the present invention, for each pin of the list of problem pins a late versus early mode slack ratio is calculated and compared against a first threshold value, wherein pins with a slack ratio not higher than the first threshold value are assigned to the first category of assignments.

In a further embodiment of the present invention, for each pin of the list of problem pins with a slack ratio higher than the first threshold value, a corresponding late mode slack is compared against a second threshold value, wherein pins with a late mode slack higher than the second threshold value are assigned to the second category of assignments and added to a first list comprising paddable pins to be fixed on integration unit level, and pins with a late mode slack not higher than the second threshold value are assigned to the third category of assignments.

In a further embodiment of the present invention, for each pin of the third category of assignments an integration unit net name is parsed for at least one delay device or buffer, wherein a corresponding pin connected to at least one delay device or buffer is added to a second list comprising fixable pins to be fixed on integration unit level.

In a further embodiment of the present invention, each pin of the third category of assignments not connected to at least one delay device or buffer or each pin of the first category of assignments is applied to an expert system.

In a further embodiment of the present invention, the expert system determines a source macro as early mode slack fix location, if a difference between a source weight value and a sink weight value is higher than a certain threshold value.

In a further embodiment of the present invention, the expert system determines a sink macro as early mode slack fix location, if a difference between the sink weight value and the source weight value is higher than a certain threshold value.

In a further embodiment of the present invention, the expert system determines no early mode slack fix location, if the difference between the source weight value and the sink weight value and the difference between the sink weight value and the source weight value are not higher than the certain threshold value.

In a further embodiment of the present invention, the expert system outputs fixable pins to be fixed in the source macro and to be added to a third list comprising fixable pins to be fixed in the source macro, fixable pins to be fixed in the sink macro and to be added to a fourth list comprising fixable pins to be fixed in the sink macro, fixable pins to be fixed at unit level and to be added to the second list comprising fixable pins to be fixed on integration unit level, critical pins to be fixed in the source macro and to be added to a fifth list comprising critical pins to be fixed in the source macro, critical pins to be fixed in the sink macro and to be added to a sixth list comprising critical pins to be fixed in the sink macro, and critical pins in doubt where to fix and to be added in a seventh list comprising critical pins in doubt.

In a further embodiment of the present invention, for each pin of the third and fifth list a corresponding source macro output pin is determined and listed in addition to the actually analyzed input pin of the sink macro.

In a further embodiment of the present invention, for each source macro output pin to be fixed an existing timing contract is maintained.

In another embodiment of the present invention, a system for fixing an early mode slack in a hierarchically designed hardware device comprises a timing analyzer for importing hardware design timing data to determining pins where an early mode slack fix is applicable to an early mode slack; at least one filter and an expert system acting like a neural network determining a location across the design hierarchy for each such pin to fix the early mode slack by calculating a weight value for each of a selection of fix locations of the early mode slack based on absolute values of arrival times of data signals, ratio and difference between arrival times of late mode data signals and early mode data signals; and assigning the early mode slack fix to the determined location based on the weight value.

In another embodiment of the present invention, a data processing program for execution in a data processing system comprises software code portions for performing a method for fixing an early mode slack in a hierarchically designed hardware device when the program is run on the data processing system.

In yet another embodiment of the present invention, a computer program product stored on a computer-usable medium, comprises computer-readable program means for causing a computer to perform a method for fixing an early mode slack in a hierarchically designed hardware device when the program is run on the computer.

All in all, embodiments of the present invention teach to determine a location where an early mode slack can be fixed with reduced effort.

Further embodiments of the present invention disclose methods to automatically determine where the early mode slack can be fixed, by additionally analyzing the arrival times of the data signals. The ratio and difference between early mode and late mode arrival times, as well as their absolute values are reliable indicators to detect whether an early mode slack that cannot be fixed on integration level, should rather be fixed in the source or sink macro.

Embodiments of the present invention method first analyze the early mode timing paths based on macro input pins, since an integration level fix should add delay devices near to these pins, and create several main categories of assignments for the early mode slack fixes. A first main category of assignments comprises paddable pins that should be fixed by adding delay devices on integration level. A second main category of assignments comprises fixable pins that can be fixed on integration level, but with a higher effort and maybe could be fixed in the macros with less effort. A third main category of assignments comprises critical pins that can only be fixed in the macros.

For the fixable and critical pins, the embodiments of the present invention determine whether the fix should be made in the source or sink macro. This could result in the following lists of macro pins, for example: Paddable pins that should be fixed on integration level; fixable pins that should be fixed on integration level; fixable pins that should be fixed in the source macro; fixable pins that should be fixed in the sink macro; critical pins that should be fixed in the source macro; critical pins that should be fixed in the sink macro; and critical pins that are in doubt where to fix. For such pins in doubt further manual investigation is performed to determine the location for the early mode slack fix.

The lists can also be saved as an HTML file that contains the lists of pins where the early mode slack fixes should be applied. For each pin, the file also contains the timing data details.

The file could begin with a set of parameters used to analyze the timing run, followed by a set of links to quickly jump to the pin list of interest, for example. Then the above mentioned pin lists could follow. Each pin list first shows all affected nets, followed by the details for each pin. The pin details combine the early mode and late mode timing results for each tested phase. For paths where the fix has been assigned to the source macro, the macro output pin to be fixed is listed in addition to the actually analyzed input pin of the sink macro.

An advanced embodiment of the method can modify the timing contracts for synthesized macros, where early mode fixes should be applied for some of their output pins. Since custom macro early mode slack fixes are applied manually, there's no need to further automate the support for early mode fixes at this level. But synthesized macros are automatically processed, and one of the main input parameters for synthesis is timing assertions. Hence, managing these timing assertions for early mode is helpful to enforce proper early mode behavior for synthesized macros.

One way to manage these timing assertions is to establish timing contracts that constrain the variability of the feedback timing assertions that are usually generated by a timing run. Since it is preferable to make early mode slack fixes in front of a sink latch, rather than after an output of a source latch, timing contracts by default do not constrain the output pin timing assertions, but ensure that no early mode delays are applied to macro output pins. This is ensured by setting the early mode output pin expected arrival time assertion for early mode to 0, i.e. the signal is allowed to arrive as early as it wants. The advanced embodiment of the method replaces this default contract for those macro output pins that have assigned an early mode slack fix. Hence, it allows timing assertion generation to propagate feedback timing assertions for this pin. In consequence, macro synthesis can ensure that the signal does not arrive earlier as needed and thus automatically fix the early mode slack.

The above, as well as additional purposes, features, and advantages of the present invention will become apparent in the following detailed written description.

BRIEF DESCRIPTION OF THE DRAWINGS

A preferred embodiment of the present invention, as described in detail below, is shown in the drawings, in which.

DETAILED DESCRIPTION OF PREFERRED EMBODIMENTS

Figure 1:
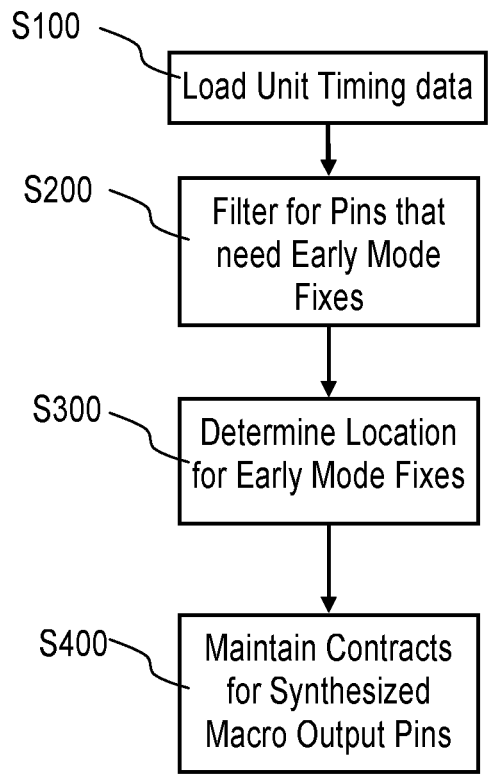
FIG. 1 is a schematic overall flow diagram of a method to fix an early mode slack in a circuit design, in accordance with an embodiment of the present invention.
Figure 2:
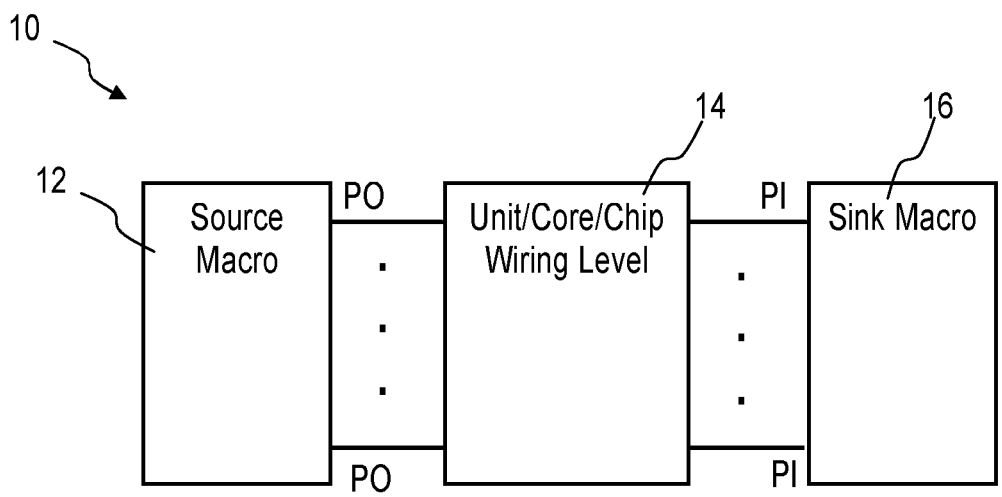
FIG. 2 is a schematic block diagram of a hardware device designed in accordance with an embodiment of the present invention.

Referring to FIGS. 1 and 2, a method for fixing an early mode slack in a hierarchically designed hardware device 10 with at least one source macro 12, an integration unit 14 and at least one sink macro 16, each of which can serve as a fix location, comprises a step S100 for loading hardware design timing data to determine pins PO, PI where an early mode slack fix shall be applied to fix an early mode slack. For each such pin PO, PI in a step S300 a location across the design hierarchy of the hardware device 10 is determined to fix the early mode slack by calculating a weight value for each of a selection of fix locations 12, 14, 16 of the early mode slack based on absolute values of arrival times of data signals, ratio and difference between arrival times of late mode data signals and early mode data signals; and the early mode slack fix is assigned to the determined location based on the weight value.

The hierarchical designs for the hardware device 10, for an example a CPU, is used to divide the design into pieces like macros, units, cores and whole chip. Since a timing path can cross the border of these pieces, it is determined which of these pieces is the right location to fix the early mode slack. This is also done to determine the person or entity who is responsible to fix the early mode slack, since usually different people or entities are responsible to fix the early mode slack, depending on whether the source macro 12, the integrating unit/core/chip wiring level 14, or the sink macro 16 is the location to be modified to fix the early mode slack. Since the method works the same way for unit, core, and whole chip timing results, for better readability the following describes it for the unit only.

A factor to detect early mode slacks, and also to evaluate fixes for them without deteriorating the late mode timing, is to consolidate the timing results of the unit early mode and late mode timing runs. To achieve this, the unit early and late mode comprehensive summary timing reports are parsed and consolidated in memory during step S100. The result is a model that contains the devices like macros 12, 16, buffers, etc., nets, and pins of the unit 14. For each device or input/output pin of the unit 14, the model also contains the timing data for each tested clock phase. So, for each output pin PO of the source macro, each input pin PI of the sink macro 16 and clock phase tested for it, late mode arrival time for rising and falling signal edge, early mode arrival time for rising and falling signal edge, late mode slack for the rising and falling signal edge, early mode slack for the rising and falling signal edge, late mode slew for the rising and falling signal edge, early mode slew for the rising and falling signal edge, wire delay, and capacitive load are contained.

The result of step S100 is a certain amount of information, since for each timing path, the early mode slack is visible on multiple pins PO, PI, but usually shall be fixed only in one location. Therefore in a following step S200 the hardware design timing data is filtered to determine sink macro input pins PI for analyzing, using at least one of the following information: pin owner representing a device where the corresponding pin is located, pin type, buffer usage, and timing phase information.

Still referring to FIGS. 1 and 2, some embodiments of the method for fixing an early mode slack in a hierarchically designed hardware device 10 perform an optional step S400 during which for each source macro output pin PO to be fixed an existing timing contract is maintained.

Figure 3:
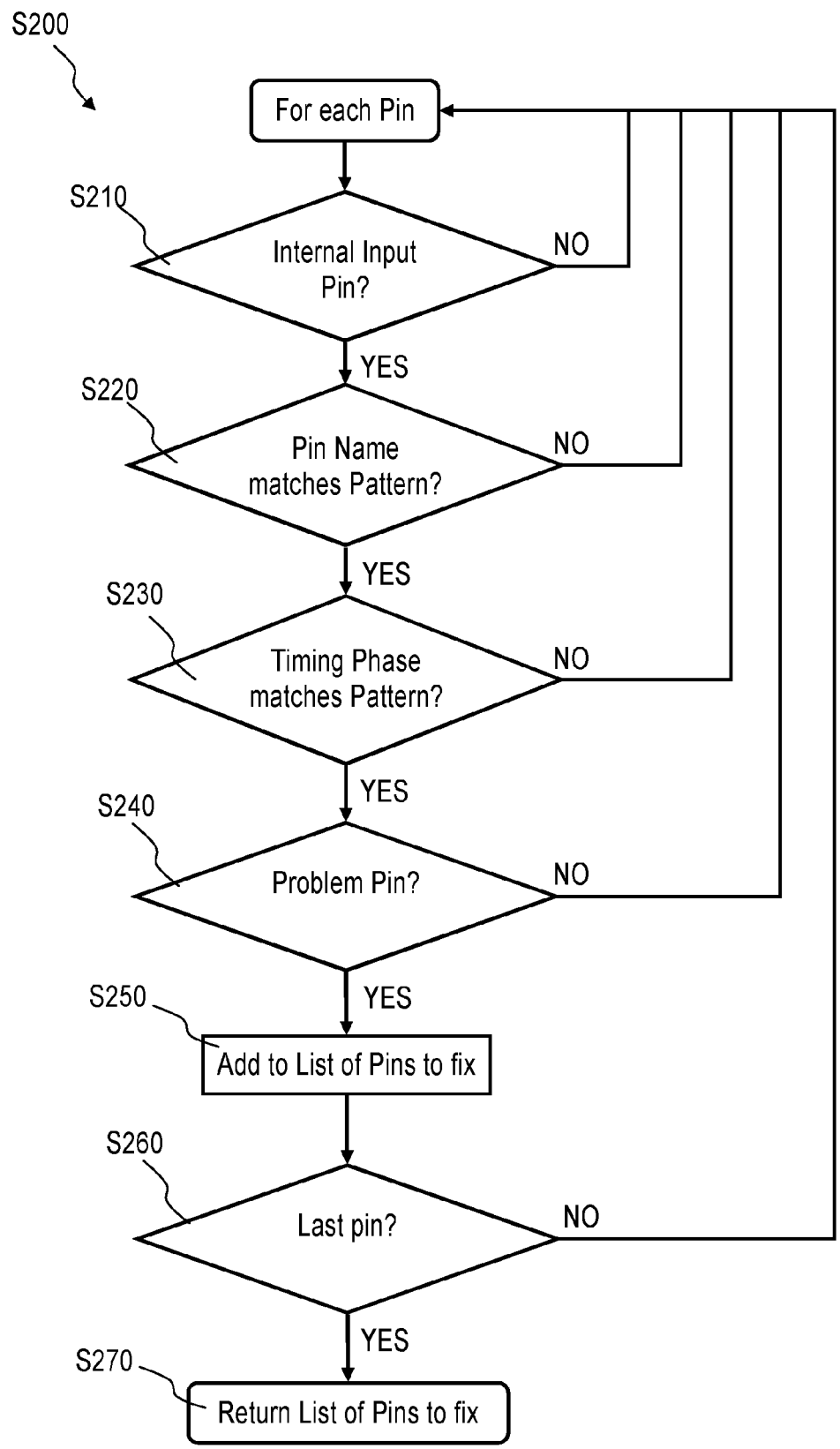
FIG. 3 is a more detailed schematic flow diagram of a filter process used in the method to fix an early mode slack in a circuit design of FIG. 1, in accordance with an embodiment of the present invention.

FIG. 3 shows a filter process step S200 used in the method to fix an early mode slack in a circuit design of FIG. 1, in accordance with an embodiment of the present invention.

Referring to FIG. 3, for each pin listed in the hardware design timing data the steps S210 to S270 are performed. To find an early mode slack, and a location to fix it, the amount of available information is significant, since for each timing path, the early mode slack is visible on multiple pins, but usually shall be fixed only in one location. So, from the pins PO, PI described in the comprehensive summary timing report, those pins are extracted, where an early mode slack fix shall be applied while it has a certain probability to be successful. Since the early mode delay devices used to fix early mode slack at unit level have only a relatively small load driving capacity, and each sink macro pin PI has different slack data, a preferred location to apply an early mode slack fix at unit level is the input pin PI of the sink macro 16 in a timing path.

Thus, macro input pins PI are used as analysis starting points. They are selected in step S210 from all the pins PI, PO available. Using the pin owner, i.e. the device where the corresponding pin is located, and the pin type, pins of the unit 14 and output pins PO of the source macro 12 can be excluded. A more complex filter is used in step S220 to distinguish macro input pins PI from input pins of buffers located in the unit 14. Since the buffers in the unit 14 are placed or inserted by tools, and these use a certain name scheme for the buffer instances, buffer pins can be excluded by their instance name. For example, a standard regular expression can be used as pattern to exclude buffer pins by their name prefix:

^(?!<UNIT_BUFFER_PREFIX>buf.*|skt.*).*$

For example:

^(?!lsbuf.*|skt.*).*$

This expression excludes pins that have a pin name that starts either with "lsbuf" or with "skt".

The shown advanced embodiment of the method for fixing an early mode slack filters the timing values by applying a phase filter in step S230, which can exclude some timing phases like scan phases from being checked. This way a more specific early mode slack determination can occur. The phase filter is an additional regular expression used as pattern to exclude timing values for not matching clock phases from being checked for early mode slacks.

After filtering for the right pins PI to analyze, the set of pins, where a fix shall be applied, is determined in step S240. This is a filter by an early mode slack threshold value $th_{early\_mode\_slack}$. Usually, value 0.0 ps, or another value like 1.0 ps that provides some safety margin, can be used as early mode slack threshold value ($th_{early\_mode\_slack}$). A pin is considered a problem pin, if statement (1) is fulfilled.

$$(\min(sl_{rising\_edge}, sl_{falling\_edge}) < th_{early\_mode\_slack}) \quad (1)$$

Wherein $sl_{rising\_edge}$ denotes the slack of the rising edge of a corresponding pin signal, and $sl_{falling\_edge}$ denotes the slack of the falling edge of a corresponding pin signal.

All pins that have an early mode slack higher than the threshold value $th_{early\_mode\_slack}$, are excluded from further processing, since no fixes need to be applied. If the rising edge slack differs from the falling edge slack, the smaller value is used by this filter.

Figure 4:
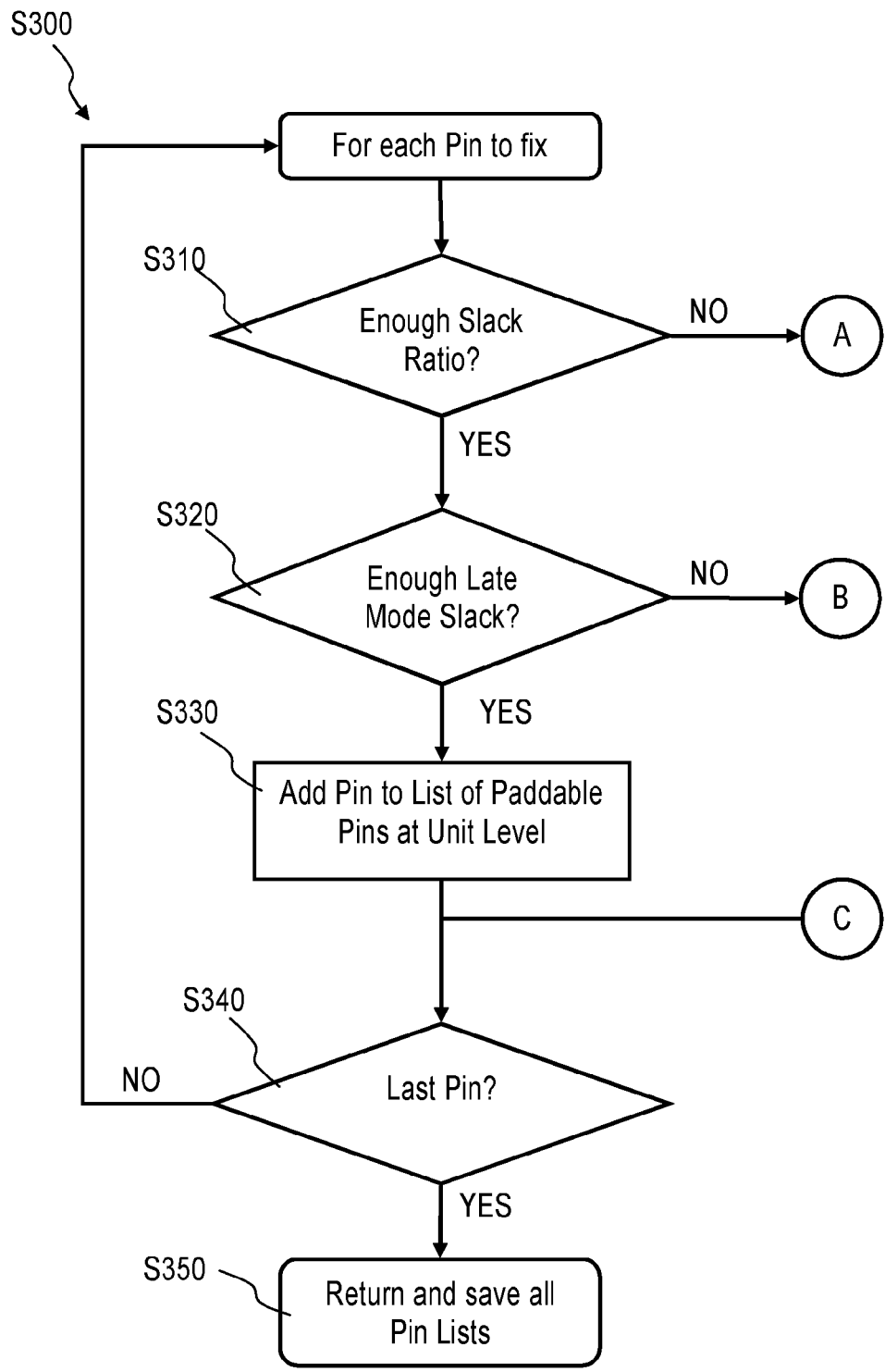
FIGS. 4 to 6 is a more detailed schematic flow diagram of a process to determine a location for an early mode fix used in the method to fix an early mode slack in a circuit design of FIG. 1, in accordance with an embodiment of the present invention.
Figure 5:
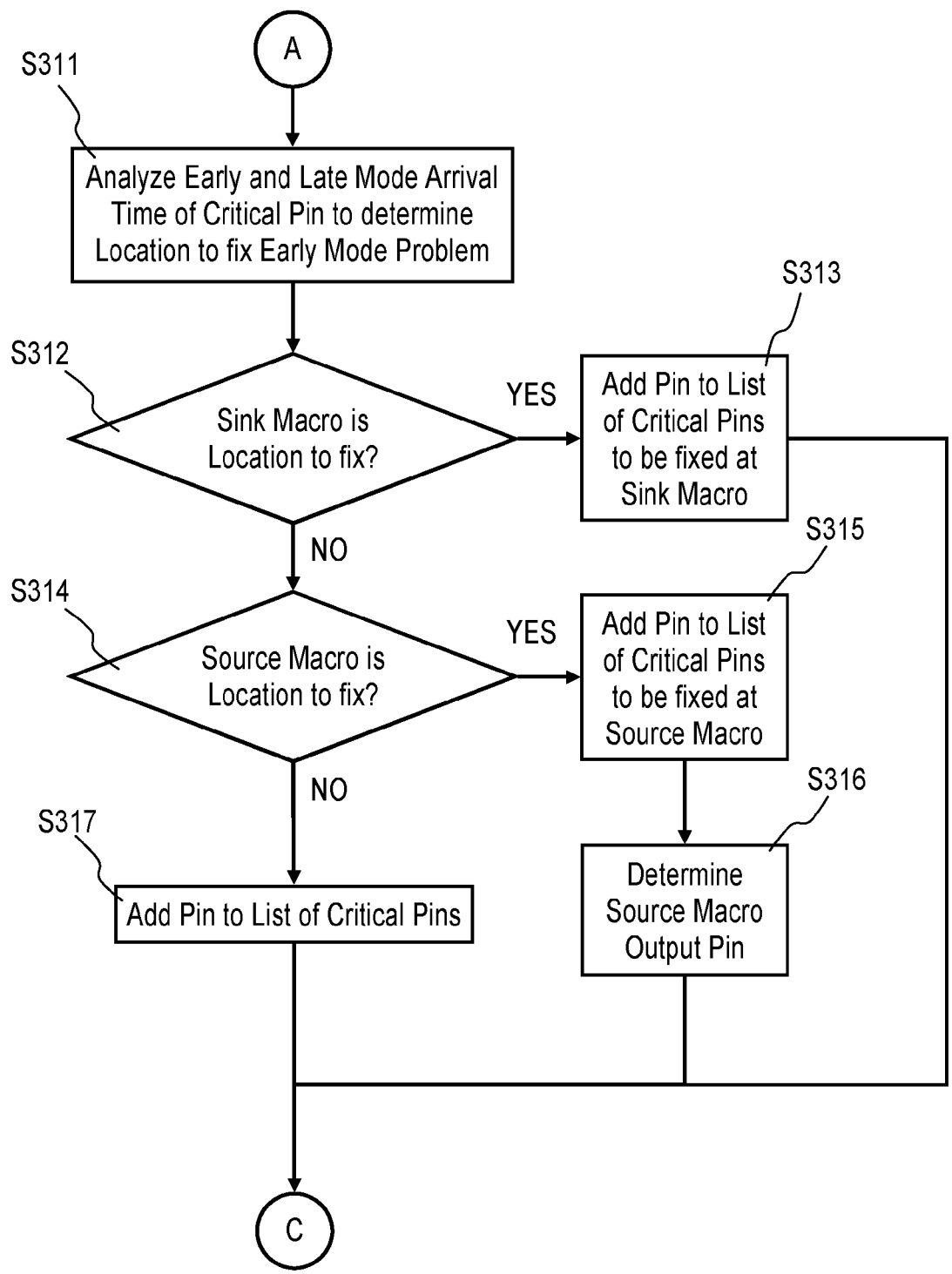
Figure 6:
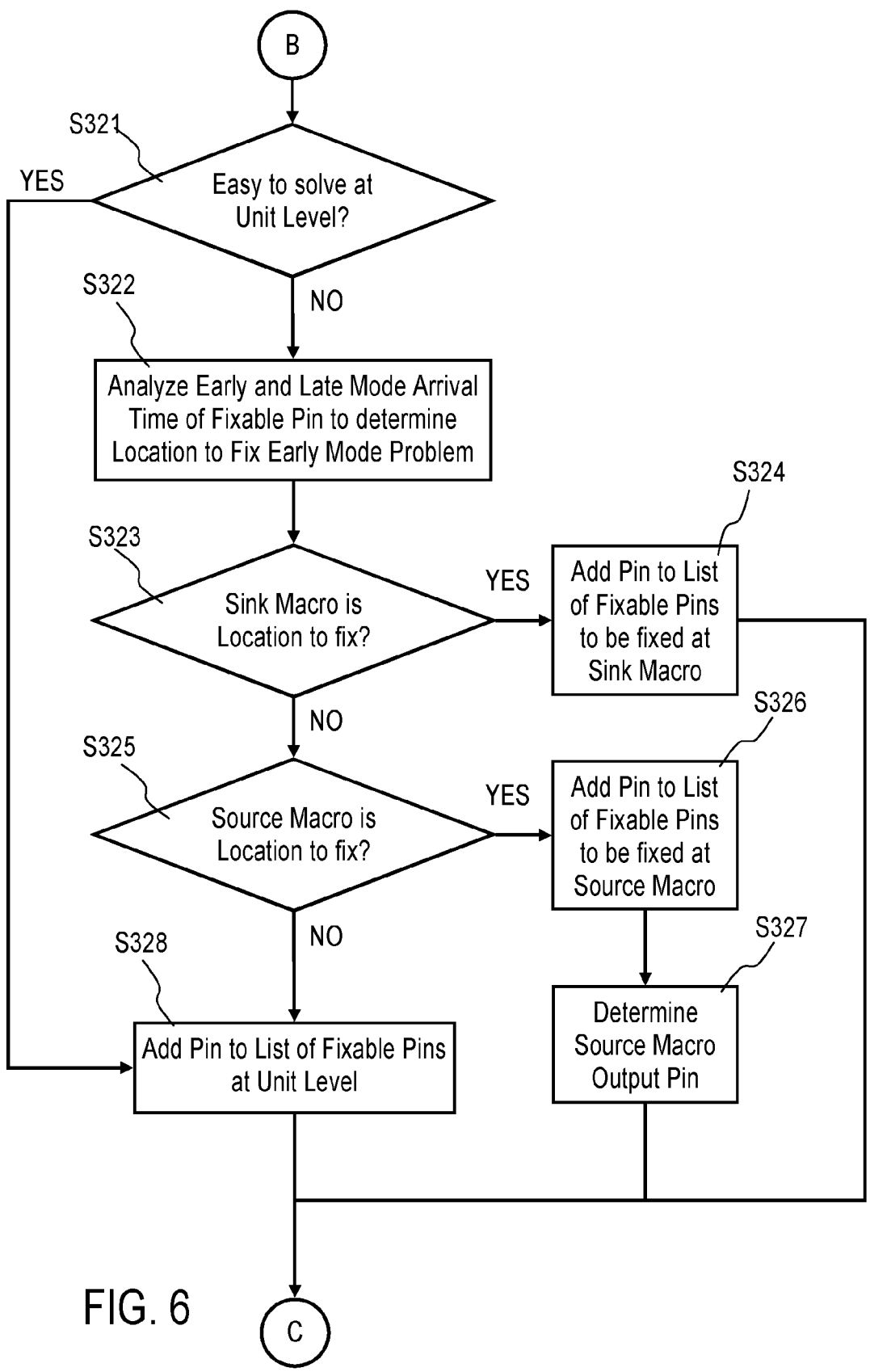
Figure 7:
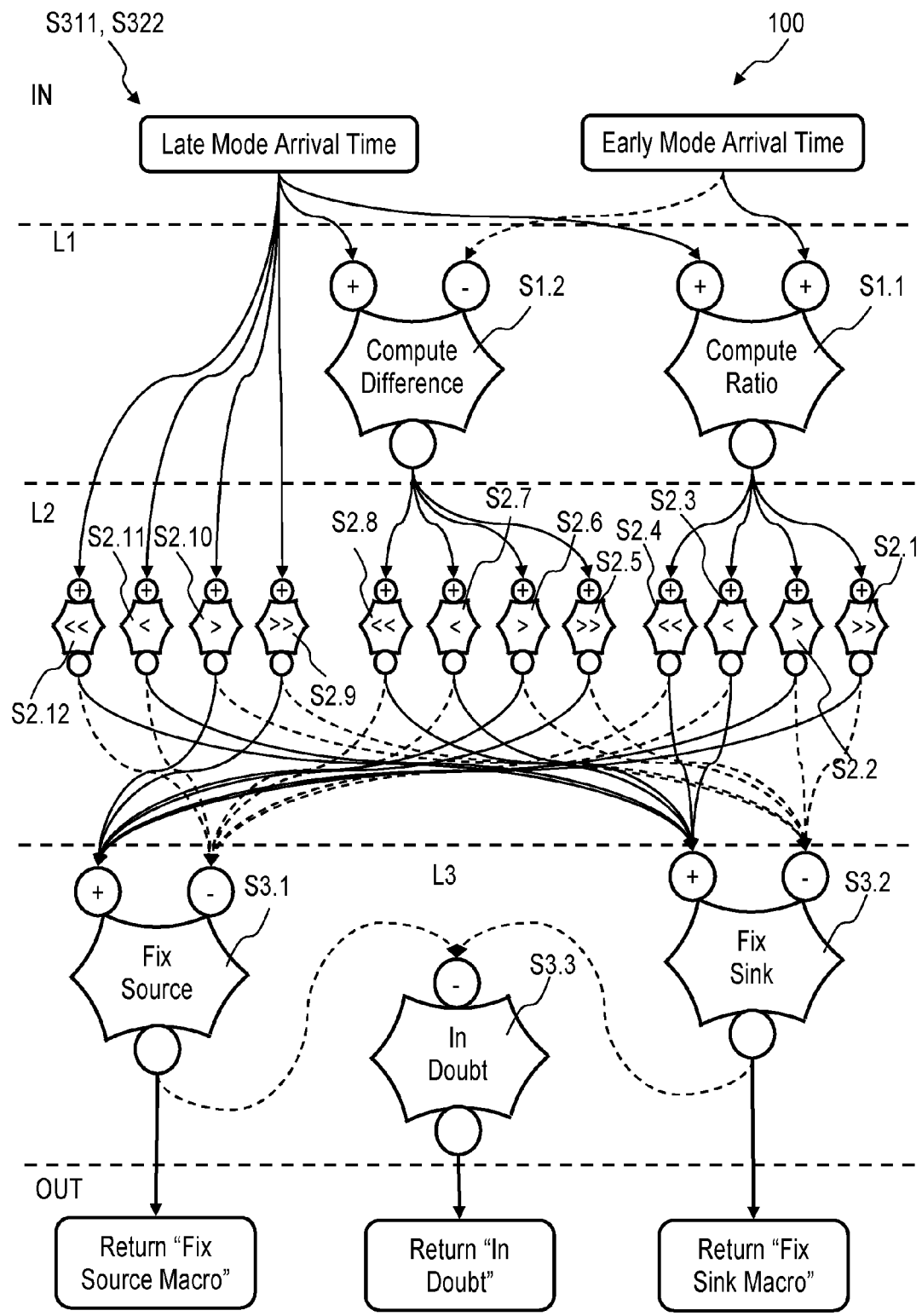
FIG. 7 is a schematic architecture of a process analyzing an early and late fixable or critical pin arrival time for the determination process of FIGS. 4 to 6, in accordance with an embodiment of the present invention.

All pins that have an early mode slack lower than the threshold value are included in a list of problem pins in step S250. If the filter process step S200 is performed for all pins PI, PO of the hardware design timing data, the list of problem pins to be fixed is returned to the main process in step S270. The resulting list of problem pins is also referred to as list of fixable pins FIGS. 4 to 6 show the process to determine a location for an early mode slack fix of step S300 used in the method to fix an early mode slack in a circuit design of FIG. 1, in accordance with an embodiment of the present invention, and FIG. 7 shows a process analyzing early and late fixable or critical pin arrival time for the determination process of FIGS. 4 to 6, in accordance with an embodiment of the present invention.

The location to fix the early mode slack detected above is determined by applying further filters to each problem pin in the list of fixable pins. A filter first determines in step S310 whether the early mode slack can be fixed at unit level 14, or shall rather be fixed in the source or sink macro 12, 16.

A way to determine whether an early mode slack can be fixed by unit level integration means is to compute the late versus early mode slack ratio for this problem pin and to compare it against a threshold value in step S310. This threshold value should be higher than the ratio between the late versus early mode delay of the pad device to insert for fixing the early mode slack. A safe value for current CMOS technology is a threshold value of 3.0, for example. The problem pin is fixable at unit level, if statement (2) is fulfilled.

$$(\min((sl_{lmre}/sl_{emre}),(sl_{lmfe}/sl_{emfe})) > th_{l/edd}) \quad (2)$$

Wherein $sl_{lmre}$ represents the late mode slack of the rising edge, $sl_{emre}$ represents the early mode slack of the rising edge, $sl_{lmfe}$ represents the late mode slack of the falling edge, $sl_{emfe}$ represents the early mode slack of the falling edge, and $th_{l/edd}$ represents the threshold of the late versus early mode device delay.

If the slack ratio is not higher than the threshold ratio $th_{l/edd}$, the early mode slack fix is better applied in the source or sink macro 12, 16. The further processing for those problem pins is described in the following, referring to FIG. 5. Problem pins where the slack ratio is higher than the threshold ratio can be fixed at unit level. But being sure that the fix can be made at unit level does not exclude, that a fix at unit level might be cumbersome. For those problem pins in step S320 can be checked, if enough late mode slack is available. If enough late mode slack is available, the problem pin is added to a list of paddable pins at unit level in step S330. If not enough late mode slack value is available, further processing for those problem pins is described in the following, referring to FIG. 6.

Enough late mode slack also called late mode slack margin is available and the problem pin is paddable at unit level, if statement (3) is fulfilled.

$$(\min(sl_{kmre}, sl_{lmfe}) > th_{ldd}) \quad (3)$$

Wherein $sl_{lmre}$ represents a late mode slack of the rising edge, $sl_{lmfe}$ represents a late mode slack of the falling edge, and $th_{ldd}$ represents a threshold of the late device delay.

Early mode slack on pins where the late mode slack margin is higher than the threshold value can be fixed at unit level and are considered paddable pins.

After applying these two filters, a sorting for where to apply the early mode fix is available. The sorting result comprises paddable pins that should be fixed by adding delay devices on integration unit; fixable pins that can be fixed on integration unit level, but also in the source or sink macros; and critical pins that can only be fixed in the macros 12, 16. After that filtering a first category of assignments comprises critical pins to be fixed in the source macro 12 or in the sink macro 16, a second category of assignments comprises paddable pins PI to be fixed on integration unit level 14 by adding delay devices or buffers, and a third category of assignments comprises fixable pins PI to be fixed on integration unit level 14 by the source macro 12 or the sink macro 16.

For the filtering above, one can apply known filtering techniques. But these techniques do not investigate which macro 12, 16 is in charge to make the fix, if a fix at unit level is not possible or cumbersome. The following sections describe the method to determine in which macro 12, 16 those early mode slacks can be fixed, which cannot be simply solved on unit level.

The late mode slack margin is used in step S320. If it is higher than the minimum late mode delay of the pad device, the early mode slack can be fixed at unit level and the problem pin is added to a list of paddable pins at unit level. Otherwise the signal might be delayed by using thinner or longer wires, which might have negative side effects like slew violations. A useful threshold value is 25 ps, but in certain cases fast buffers can be used as delay devices too, and then even 15 ps can be used as a threshold value. If the slack ratio is not higher than the threshold ratio $th_{l/edd}$, further processing according to FIG. 6 is applied for those problem pins.

Referring now to FIG. 5, if the slack ratio according to step S310 is not higher than the threshold ratio $th_{l/edd}$, the early mode slack fix is better applied in the source or sink macro 12, 16. So, the shown embodiment of the method for fixing an early mode slack in a hierarchically designed hardware device 10 analyzes early and late mode arrival time of the problem pin in step S311 of FIG. 5 to determine the location to fix the early mode slack. A reliable indicator for where a fix can be more successful is the early and late mode arrival time at the sink macro input pin PI. But there's no simple criterion available to distribute the early mode slack fixes, so a more complex solution with multiple comparisons and weighing their results can be used. The analyzing process of step S311 is described in the following, referring to FIG. 7.

Step S312 checks, if the result of the analyzing process of step S311 corresponds to the sink macro 16 as location to fix the early mode slack. If the sink macro 16 is the location to fix the early mode slack, the corresponding problem pin is added to the list of critical pins to be fixed at the sink macro 16 in step S313. If the sink macro 16 is not the location to fix the early mode slack, step S314 checks, if the result of the analyzing process of step S311 corresponds to the source macro 12 as location to fix the early mode slack. If the source macro 12 is the location to fix the early mode slack, the corresponding problem pin is added to the list of critical pins to be fixed at the source macro 16 in step S315. Then step S316 determines the corresponding output pin PO of the source macro 12. If the source macro 12 is not the location to fix the early mode slack, the corresponding pin is added to the list of critical pins in step S317. After adding the corresponding problem pin to one of the pin lists, the process returns to step S340 of FIG. 4. Step S340 checks it the last pin in the list of problem pins has been processed. If not, the process is repeated for the next pin in the list of problem pins. If all pins in the list of problem pins have been processed, all pin lists are returned and saved in step S350.

Referring now to FIG. 6, early mode slacks on fixable pins can theoretically both be solved on unit level, as well as on macro level. So, the shown embodiment of the method for fixing an early mode slack in a hierarchically designed hardware device 10 first checks in step S321 of FIG. 6 whether a fix at unit level is easy, i.e. a buffer is already in place that can be replaced by another buffer or delay device in order to fix the early mode slack. A fixable problem pin is fixable at unit level, if statement (4) is fulfilled.

$$(net\_name_{connected\_to\_macro\_input\_pin}\text{contains}(\text{``\&''})) \quad (4)$$

Since net names that are driven by a buffer or delay device have a specific annotation, which means that they contain the pattern "&<buffer index>", a filter for this annotation can determine where to apply a fix.

If statement (4) is fulfilled, the problem pin is added to a list of fixable pins at unit level in step S328. If statement (4) is not fulfilled, in step S322 early and late mode arrival time of the fixable pin is analyzed to determine a location to fix the early mode slack. A reliable indicator for where a fix can be more successful is the early and late mode arrival time at the sink macro input pin PI. But there's no simple criterion available to distribute the early mode slack fixes, so a more complex solution with multiple comparisons and weighing their results can be used. The analyzing process of step S322 is described in the following, referring to FIG. 7.

Step S323 checks, if the result of the analyzing process of step S322 corresponds to the sink macro 16 as location to fix the early mode slack. If the sink macro 16 is the location to fix the early mode slack, the corresponding pin is added to the list of fixable pins to be fixed at the sink macro 12 in step S324. If the sink macro 16 is not the location to fix the early mode slack, step S325 checks, if the result of the analyzing process of step S322 corresponds to the source macro 12 as location to fix the early mode slack. If the source macro 12 is the location to fix the early mode slack, the corresponding pin is added to the list of fixable pins to be fixed at the source macro 16 in step S326. Then step S327 determines the corresponding output pin PO of the source macro. If the source macro 12 is not the location to fix the early mode slack, the corresponding pin is added to the list of fixable pins at unit level in step S328.

After adding the corresponding problem pin to one of the pin lists, the process returns to step S340 of FIG. 4. Step S340 checks it the last pin in the list of problem pins has been processed. If not, the process is repeated for the next pin in the list of problem pins. If all pins in the list of problem pins have been processed, all pin lists are returned and saved in step S350.

Referring to FIG. 7 the analyzing process of the shown embodiment according to step S311 or S322 can act like an already trained neural network, and can be implemented with a mix of an expert system and fuzzy logic, for example. It weighs the results of the various expert hypothesis comparisons (neurons), and computes the final result.

For a better understanding, first expert system architecture 100 is described as neural network and then details of the hypotheses, used by each neuron respectively expert hypothesis, are described. The neural network 100 consists of three layers L1, L2, L3, and a late mode arrival time and an early mode arrival time are used as input information IN to the expert system 100, and "Fix Source Macro", "Fix Sink Macro" and "In Doubt" are used as output information OUT of the expert system 100.

The first layer L1 computes intermediary results like the ratio between late and early mode arrival time at a first neuron S1.1, and a difference between late and early mode arrival time at a second neuron S1.2. The second layer L2 consists of three groups of neurons S2.1 to S2.4; S2.5 to S2.8; and S2.9 to S2.12 that use different input signals and evaluate the input values to give more weight to either the source or sink macro 12, 16. The third layer L3 uses three neurons S3.1 to S3.3 to decide if the source or sink macro 12, 14 is in charge to fix the early mode slack or decides and outputs "In Doubt" if further processing such as manual processing should be performed to decide where to fix the early mode slack.

The neural network 100 is implemented as expert system that first evaluates a set of hypotheses, and based on evaluation results gives more weight to source or sink macro 12, 16. This weight is evaluated in a further step to distribute the slack fixes to unit level integration, source or sink macro.

As expert system hypotheses the ratio between early and late mode arrival time at the corresponding sink macro input pin PI is evaluated by the first neuron S1.1. The difference between late and early mode arrival time at the corresponding sink macro input pin PI is evaluated by the second neuron S1.2. Further the late mode arrival time at the corresponding sink macro input pin PI is evaluated using the hardware design timing data directly.

Here a level of detail is added that could be used in the architecture description of the neural network 100 above. The difference between the rising and falling edge arrival times is considered to get a more precise evaluation and to capture the full bandwidth of possibilities. So for each hypothesis the minimum and maximum values are computed in a first step, and for each comparison, the matching value is used by a second step.

First, the following values are computed as input for hypothesis evaluations at the first neural layer L1. In the first level L1 a first neuron S1.1 calculates a maximum of late versus early mode arrival time ratio $\max_{LEATR}$ according to equation (1).

$$\max_{LEATR} = \max(at_{lr}/at_{er}, at_{lf}/at_{ef}) \quad (1)$$

Wherein $at_{lr}$ represents the arrival time of the late rising edge, $at_{er}$ represents the arrival time of the early rising edge, $at_{lf}$ represents the arrival time of the late falling edge, and $at_{ef}$ represents the arrival time of the early falling edge.

The first neuron S1.1 in the first level L1 calculates also a minimum of late versus early mode arrival time ratio $\min_{LEATR}$ according to equation (2).

$$\min_{LEATR} = \min(at_{lr}/at_{er}, at_{lf}/at_{ef}) \quad (2)$$

In the first level L1 a second neuron S1.2 calculates a maximum difference between late and early mode arrival time $\max_{LEATD}$ according to equation (3).

$$\max_{LEATD} = \max(at_{lr}-at_{er}, at_{lf}-at_{ef}) \quad (3)$$

Wherein $at_{lr}$ represents the arrival time of the late rising edge, $at_{er}$ represents the arrival time of the early rising edge, $at_{lf}$ represents the arrival time of the late falling edge, and $at_{ef}$ represents the arrival time of the early falling edge.

The second neuron S1.2 in the first level L1 calculates also a minimum difference between late and early mode arrival time $\min_{LEATD}$ according to equation (4).

$$\min_{LEATD} = \min(at_{lr}-at_{er}, at_{lf}-at_{ef}) \quad (4)$$

For consistency, the first level L1 calculates also a maximum of late mode arrival time $\max_{LAT}$ according to equation (5).

$$\max_{LAT} = \max(at_{lr}, at_{lf}) \quad (5)$$

For consistency, the first level L1 calculates also a minimum of late mode arrival time $\min_{LAT}$ according to equation (6).

$$\min_{LAT} = \min(at_{lr}, at_{lf}) \quad (6)$$

Second, the hypotheses are evaluated to compute the weights at the second neural layer L2. In the second layer L2 a first group of neurons S2.1 to S2.4 evaluates the maximum ratio between late and early mode arrival time $\max_{LEATR}$ at sink macro input pin PI and compares it with different threshold values T1, T2, and evaluates the minimum ratio between early and late mode arrival time $\min_{LEATR}$ at sink macro input pin PI and compares it with different threshold values T3, T4, wherein T1=3, T2=2.7, T3=2.3, and T4=2.0, for example. If the maximum ratio of late versus early mode arrival time $\max_{LEATR}$ is higher than a first threshold value T1 ($\max_{LEATR}>$T1) a first neuron S2.1 of the second level L2 representing a "very high ratio" increments the source weight at a first neuron S3.1 of the third level L3. If the maximum ratio of late versus early mode arrival time $\max_{LEATR}$ is higher than a second threshold value T2 ($\max_{LEATR}>$T2) a second neuron S2.2 of the second level L2 representing a "high ratio" increments the source weight at the first neuron S3.1 of the third level L3. If the minimum ratio of late versus early mode arrival time $\min_{LEATR}$ is lower than a third threshold value T3 ($\min_{LEATR}<$T3) a third neuron S2.3 of the second level L2 representing a "low ratio" increments the sink weight at a second neuron S3.2 of the third level L3. If the minimum ratio of late versus early mode arrival time $\min_{LEATR}$ is lower than a fourth threshold value T4 ($\min_{LEATR}<$T4) a fourth neuron S2.4 of the second level L2 representing a "very low ratio" increments the sink weight at the second neuron S3.2 of the third level L3. All four hypotheses are evaluated, so a very high ratio gives more weight to the source 12 than a medium high one, and a very low ratio gives more weight to the sink 16 than a medium low one.

In the second layer L2 a second group of neurons S2.5 to S2.8 evaluates the maximum difference between late and early mode arrival time $\max_{LEATD}$ at sink macro input pin PI and compares it with different threshold values T5, T6, and evaluates the minimum difference between late and early mode arrival time $\min_{LEATD}$ at sink macro input pin PI and compares it with different threshold values T7, T8, wherein T5=90, T6=80, T7=70, and T8=60, for example. If the maximum difference between late and early mode arrival time $\max_{LEATD}$ is higher than a fifth threshold value T5 ($\max_{LEATD}>$T5) a fifth neuron S2.5 of the second level L2 representing a "very high difference" increments the source weight at the first neuron S3.1 of the third level L3. If the maximum difference between late and early mode arrival time $\max_{LEATD}$ is higher than a sixth threshold value T6 ($\max_{LEATD}>$T6) a sixth neuron S2.6 of the second level L2 representing a "high difference" increments the source weight at the first neuron S3.1 of the third level L3. If the minimum difference between late and early mode arrival time $\min_{LEATD}$ is lower than a seventh threshold value T7 ($\min_{LEATD}$<T7) a seventh neuron S2.7 of the second level L2 representing a "low difference" increments the sink weight value at the second neuron S3.2 of the third level L3. If the minimum difference between late and early mode arrival time $\min_{LEATD}$ is lower than an eighth threshold value T8 ($\min_{LEATD}$<T8) an eighth neuron S2.8 of the second level L2 representing a "very low difference" increments the sink weight value at the second neuron S3.2 of the third level L3. All four hypotheses are evaluated, so a very high difference gives more weight to the source 12 than a medium high one, and a very low difference gives more weight to the sink 16 than a medium low one.

In the second layer L2 a third group of neurons S2.9 to S2.12 evaluates the maximum late mode arrival time $\max_{LAT}$ at sink macro input pin PI, and compares it with different threshold values T9, T10, and evaluates the minimum late mode arrival time $\min_{LAT}$ at sink macro input pin PI and compares it with different threshold values T11, T12, wherein T9=120, T10=100, T11=90, and T12=80, for example. The values used here are cycle time dependent and might vary with the chip frequency. If the maximum late mode arrival time $\max_{LAT}$ is higher than a ninth threshold value T9 ($\max_{LAT}$>T9) a ninth neuron S2.9 of the second level L2 representing a "very late arrival" increments the source weight value at the first neuron S3.1 of the third level L3. If the maximum late mode arrival time $\max_{LAT}$ is higher than a tenth threshold value T10 ($\max_{LAT}$>T10) a tenth neuron S2.10 of the second level L2 representing a "late arrival" increments the source weight value at the first neuron S3.1 of the third level L3. If the minimum late mode arrival time $\min_{LAT}$ is lower than an eleventh threshold value T11 ($\min_{LAT}$<T11) an eleventh neuron S2.11 of the second level L2 representing an "early arrival" increments the sink weight value at the second neuron S3.2 of the third level L3. If the minimum late mode arrival time $\min_{LAT}$ is lower than a twelfth threshold value T12 ($\min_{LAT}$<T12) a twelfth neuron S2.12 of the second level L2 representing a "very early arrival" increments the sink weight value at the second neuron S3.2 of the third level L3. All four hypotheses are evaluated, so a very late arrival gives more weight to the source 12 than a medium late one, and a very early arrival gives more weight to the sink 16 than a medium early one.

Third, neurons S3.1, S3.2, S3.3 of the third neural layer L3 distribute the early mode slacks to source or sink macros 12, 16 according to the weight values determined above. In the third layer L3 the first neuron S3.1 representing the "source" evaluates the difference between the source weight value $w_{so}$ and the sink weight value $w_{sk}$ for the sink macro input pin PI, and compares it with a threshold value T13, wherein T13=2, for example. If the difference between the source weight value $w_{so}$ and the sink weight value $w_{sk}$ is higher than a thirteenth threshold value T13 (($w_{so}-w_{sk}$)>T13) the first neuron S3.1 of the third layer L3 assigns the source macro as fix location. In the third layer L3 the second neuron S3.2 representing the "sink" evaluates the difference between the sink weight value $w_{sk}$ and the source weight value $w_{so}$ for the sink macro input pin PI, and compares it also with the threshold value T13. If the difference between the sink weight value $w_{sk}$ and the source weight value $w_{so}$ is higher than the thirteenth threshold value T13 (($w_{sk}-w_{so}$)>3) the second neuron S3.2 of the third layer L3 assigns the sink macro as fix location. Else a third neuron S3.3 of the third layer representing a "in doubt" situation, outputs no fix location for the sink macro input pin PI.

If the difference between source and sink weight value is not sufficiently significant, the method leaves the pin in the general lists of critical respectively fixable pins. It is better when a human makes the final decision for in doubt pins, than to wrongly assign them to a certain macro.

In summary the result of embodiments of the present method is a distribution of the early mode slack to one of the following lists: Paddable pins that should be fixed at integration level 14; fixable pins that should be fixed at integration level 14; fixable pins that should be fixed in the source macro 12; fixable pins that should be fixed in the sink macro 16; critical pins that should be fixed in the source macro 12; critical pins that should be fixed in the sink macro 16; critical pins that are in doubt and shall be further analyzed.

The resulting data is either displayed in a graphical user interface, or saved as a file with all the lists and pin (timing) details as shown above.

For the fixable and critical pins that should be fixed in the sink macro 16, embodiments of the present invention also determine the source macro 12 and its output pin PO where the fix should be applied, according to step S316 or S327.

For each sink macro input pin PI in these lists, it first extracts the net it is connected to. If the net name follows a buffer or delay device (net name contains ("&")), it retrieves this buffer, for this buffer the input pin, and for this pin the net. This is applied in a loop until a net name without '&' in its name is reached. If the net name does not contain '&' in its name, the source for this net is the output pin PO to be fixed, and the owner of this pin is the macro to be fixed.

Figure 8:
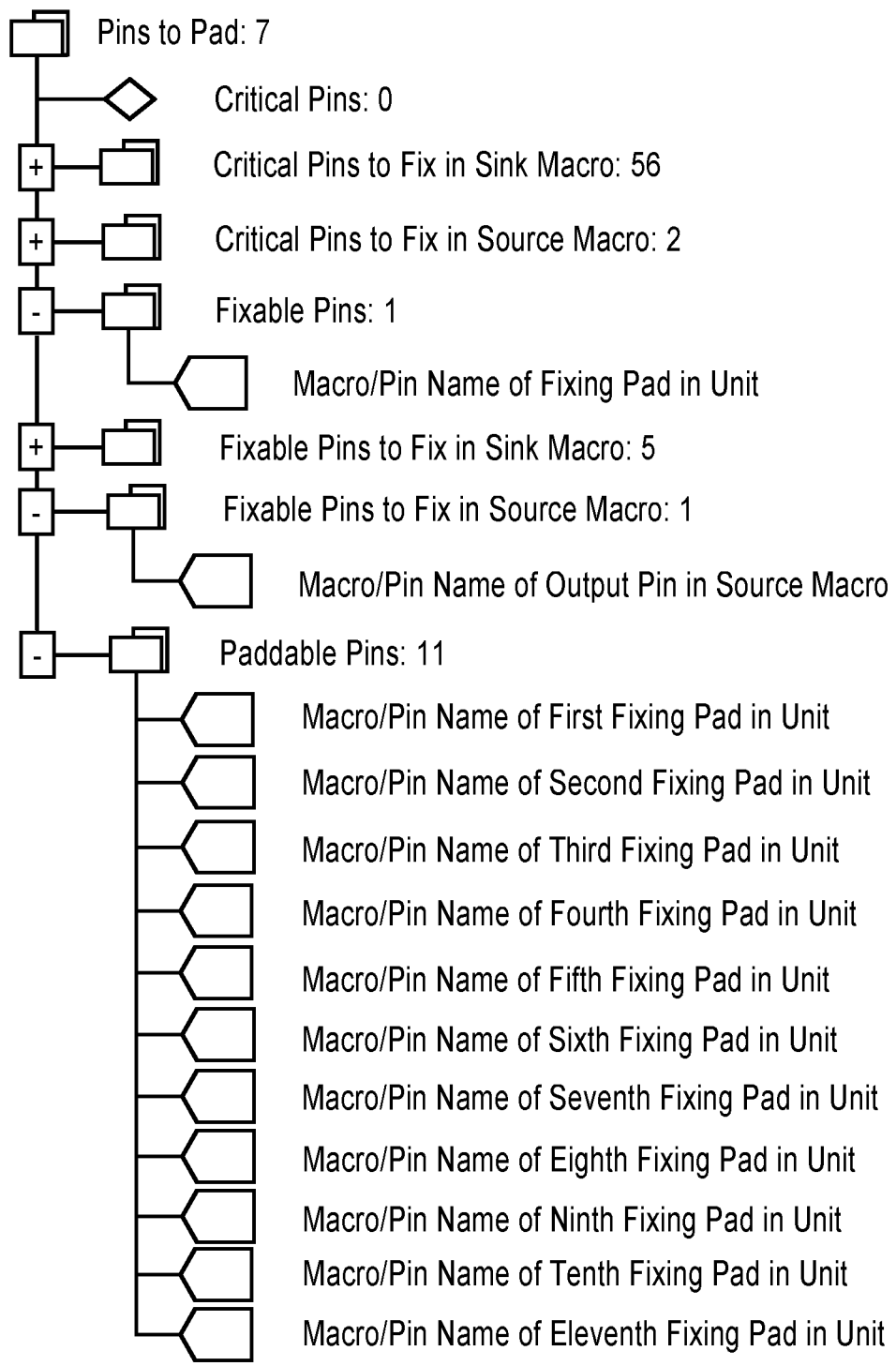
FIG. 8 is a schematic diagram of a possible output of the method to fix an early mode slack in a circuit design of FIG. 1, in accordance with an embodiment of the present invention.

FIG. 8 shows a possible output of the method to fix an early mode slack in a circuit design of FIG. 1, in accordance with an embodiment of the present invention.

In the shown example, the list of paddable pins that should be fixed at integration level 14 comprises eleven pins with corresponding addresses; the list of fixable pins that should be fixed at integration level 14 comprises one pin with corresponding address; the list of fixable pins that should be fixed in the source macro 12 comprises one pin with a corresponding address; the list of fixable pins that should be fixed in the sink macro 16 comprises five pins; the list of critical pins that should be fixed in the source macro 12 comprises two pins; the list of critical pins that should be fixed in the sink macro 16 comprises fifty-six pins; and the list of critical pins that are in doubt and shall be further analyzed comprises no pins.

Figure 9:
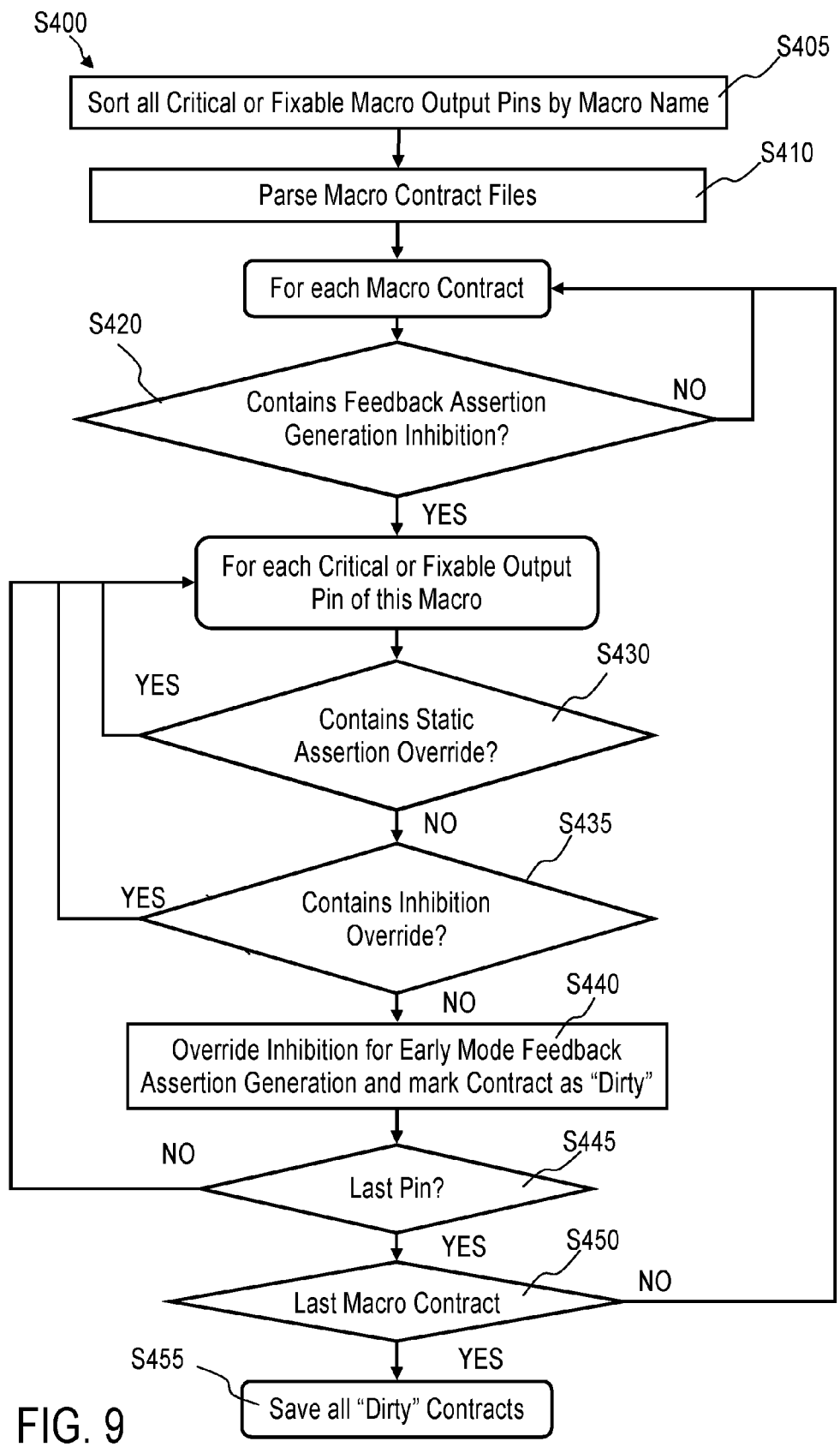
FIG. 9 is a more detailed schematic flow diagram of a process to maintain contracts for synthesized macro output pins used in the method to fix an early mode slack in a circuit design of FIG. 1, in accordance with an embodiment of the present invention.

FIG. 9 shows a process S400 to maintain timing contracts for synthesized macro output pins used in the method to fix an early mode slack in a circuit design of FIG. 1, in accordance with an embodiment of the present invention.

The advanced embodiment of the method to fix an early mode slack in a circuit design can modify the timing contracts for synthesized macros, where early mode slack fixes should be applied for some of their output pins PO. Synthesized macros are automatically processed, and one of the input parameters for synthesis is containing timing assertions. Hence, managing these timing assertions for early mode slack is helpful to ensure a predetermined early mode behavior for synthesized macros. One way to manage these timing assertions is to establish timing contracts that constrain the variability of the feedback timing assertions that are usually generated by a timing run. Since it is preferable to make an early mode slack fix in front of a sink latch, rather than after an output of a source latch, timing contracts by default do not constrain the output pin timing assertions, but ensure that no early mode delays are applied to macro output pins PO. This is ensured by setting the early mode output pin expected arrival time assertion for early mode to 0, i.e. the signal is allowed to arrive arbitrarily early. The advanced embodiment of the method to fix an early mode slack in a circuit design replaces this default contract for those macro output pins PO that have assigned an early mode slack fix. Hence, it allows timing assertion generation to propagate feedback timing assertions for this output pin PO. In consequence, macro synthesis can ensure that the signal does not arrive earlier as needed and thus automatically fix the early mode slack.

The advanced embodiment of the present invention shown in FIG. 9 also maintains the early mode timing contracts for synthesized source macros 12. For each source macro 12 that has been determined as a location to fix the corresponding early mode slack, the timing contract file is loaded and edited. For each of the determined output pins PO of the source macro 12 to be fixed, a line is added or maintained, which ensures that a valid early mode assertion is generated, which would not happen for synthesized macros by default.

The timing contract maintenance consists of the following steps: Sort all determined critical or fixable output pins PO of the source macro 12 by macro name. Parse timing contract files for source macros 12 to fix into memory. For each source macro 12 analyze whether early mode feedback timing assertion generation is inhibited. Analyze whether a timing contract exists for all output pins PO of the source macro 12 determined as location to fix the early mode slack. Establish a new timing contract that supports early mode feedback timing assertions if it does not already exist for the corresponding output pin PO. Continue until all output pins PO of all source macros 12 are processed. Save edited timing contract files.

Referring to FIG. 9, in step S405 all critical or fixable output pins PO are sorted by macro name to optimize processing performance. In step S410 timing contract files for all source macros 12 to fix are parsed into memory. All contract files are stored in the same directory. Based on this directory, the right timing contract file is loaded under its name which consists of <macroName>.override. If a timing contract does not exist, there is no need to maintain it, since it cannot inhibit the generation of feedback timing assertions. If a timing contract for the source macro 12 is found, in step S420 it is checked for the lines that inhibit the generation of early mode feedback timing assertions. If these lines are not found, early mode timing assertion generation is not inhibited, and nothing has to be done for this macro contract and the process continues for the next macro contract in the loop with step S420. If inhibit lines are found, for all critical or fixable output pins PO of the source macro 12 to fix step S430 looks for static override statements for the output pins PO or a corresponding bus in the timing contract file. If static override statements exist, they override the inhibition statement and nothing needs to be changed and the process continues for the next output pin PO in the loop with step S430. Otherwise step S435 looks for inhibition override statements overriding the feedback timing assertion generation inhibition for this output pin PO or the corresponding bus. If an inhibition override statement is found, the contract already supports feedback timing assertions for this pin and no change is needed and the process continues for the next output pin PO in the loop with step S430. Otherwise a statement is added in step S440 in order to override the inhibition for early mode feedback timing assertion generation. In addition the macro timing contract is marked "dirty". Step S445 checks, if the last output pin PO of same source macro 12 is processed. If not, the process continues for the next output pin PO in the loop with step S430. If the last output pin PO of the source macro 12 is processed step S450 checks, if the last macro timing contract is processed. If not, the process continues for the next macro timing contract in the loop with step S420. If the last macro contract is processed, step S455 saves the timing contract file for all macro timing contracts marked "dirty".

A system, especially for performing a method for fixing an early mode slack in a hierarchically designed hardware device 10, comprises a timing analyzer S100 for importing hardware design timing data to determine pins PO, PI where an early mode slack fix is applicable to fix an early mode slack; at least one filter S210, S220, S230, S240 and an expert system 100 acting like a neural network determining a location across the design hierarchy 10 for each such pin to fix the early mode slack by calculating a probability value for each of a selection of fix locations 12, 14, 16 of the early mode slack based on absolute values of arrival times of data signals, ratio and difference between arrival times of late mode data signals and early mode data signals; and assigning the early mode slack fix to the determined location.

Figure 10:
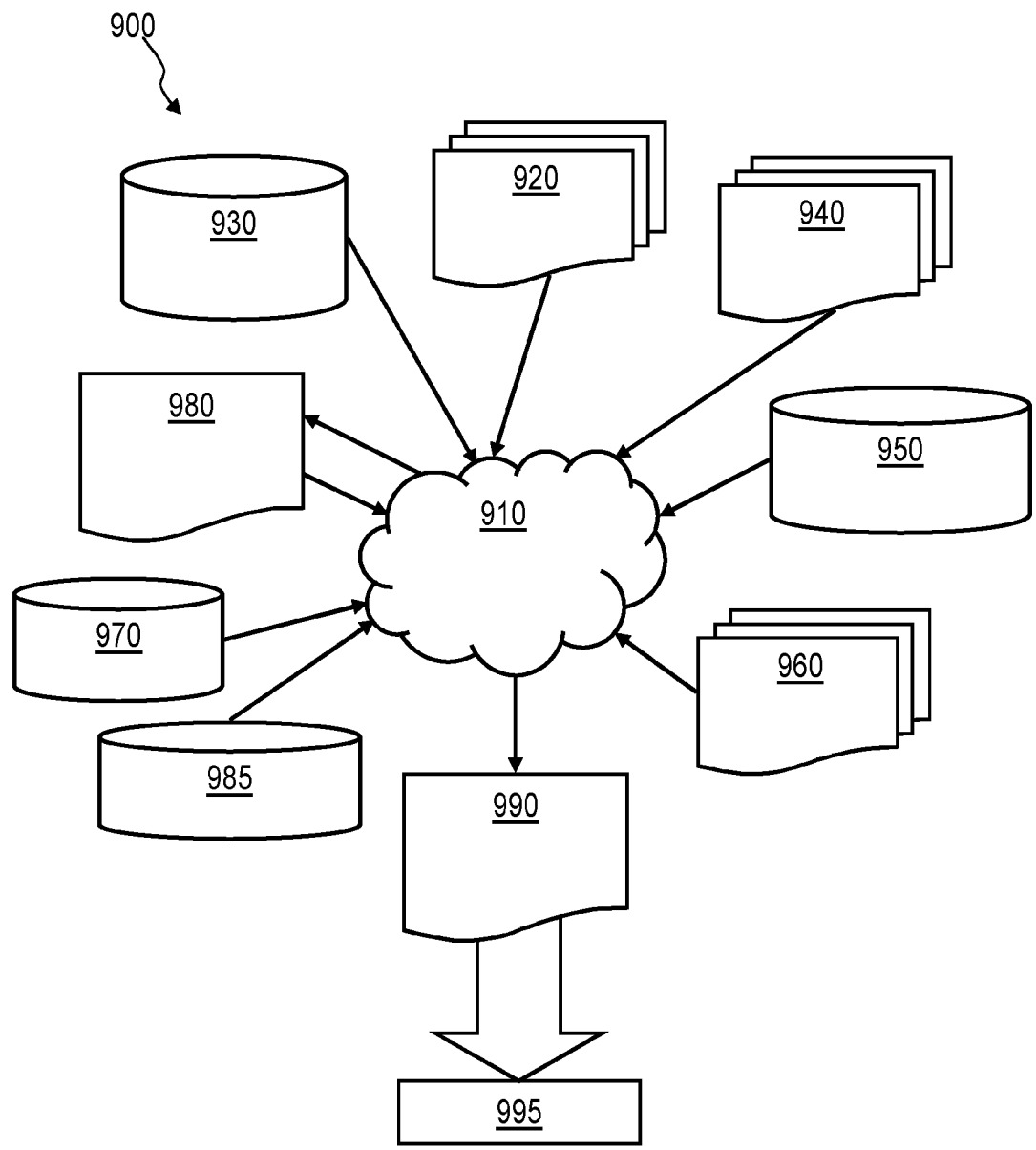
FIG. 10 is a schematic flow diagram of a design process used in semiconductor design, manufacture, and/or test.

Referring now to FIG. 10, FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices shown in FIG. 2. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as the hardware device 10 shown in FIG. 2 comprising at least one source macro 12, an integrating unit/core/chip wiring level 14, and at least one sink macro 16. As such, design structure 920 may comprise files or other data structures including human and/or machine-readable source code, compiled structures, and computer-executable code structures that when processed by a design or simulation data processing system functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 2 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more embodiments of the hardware device 10 shown in FIG. 2. In one embodiment, design structure 990 may comprise a compiled, executable HDL simulation model that functionally simulates the hardware device 10 shown in FIG. 2.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure shown in FIG. 2. Design structure 990 may then proceed to a stage 995 where, for example, design structure 990 proceeds to tape-out, is released to manufacturing, is released to a mask house, is sent to another design house, is sent back to the customer, etc.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The method and the system as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for fixing an early mode slack in a hierarchically designed hardware device having a device design comprising a plurality of locations, the plurality of locations comprising a source macro, an integration unit and a sink macro, said method comprising:
loading hardware design timing data for said device design to determine one or more pin locations where an early mode slack is detected, wherein said pin locations couple the integration unit with one of the source macro or the sink macro and wherein the loaded hardware design timing data includes a plurality of filtered timing data by applying a phase filter to exclude a plurality of scan phases from being checked, wherein the phase filter is an additional regular expression used as a pattern to exclude timing values that do not match a pin owner, a pin type, a buffer usage, and a plurality of timing phase information;
for each such pin locations determining a location within said design for applying an early mode slack fix by calculating a weight value for each of a selection of potential fix locations based on absolute values of arrival times of data signals, ratio and difference between arrival times of late mode data signals and early mode data signals;
applying said early mode slack fix to said determined location in said device design based on said weight value; and
fabricating an integrated circuit chip using the device design that includes the early mode slack fix.

2. The method according to claim 1, wherein an early mode slack threshold value is used to determine sink macro input pins to be fixed resulting in a list of problem pins.

3. The method according to claim 2, wherein based on said list of problem pins early mode timing paths are analyzed to create categories of assignments for said early mode slack fixes.

4. The method according to claim 3, wherein a first category of assignments is selected to comprise critical pins to be fixed in said source macro or in said sink macro, a second category of assignments is selected to comprise pins to be fixed on integration unit level by adding delay devices or buffers, and a third category of assignments is selected to comprise fixable pins to be fixed on integration unit level by modifying delay devices or buffers in said source macro or in said sink macro.

5. The method according to claim 4, wherein for each pin of said list of problem pins a late versus early mode slack ratio is calculated and compared against a first threshold value, wherein pins with a slack ratio not higher than said first threshold value are assigned to said first category of assignments.

6. The method according to claim 5, wherein for each pin of said list of problem pins with a slack ratio higher than said first threshold value, a corresponding late mode slack is compared against a second threshold value, wherein pins with a late mode slack higher than said second threshold value are assigned to said second category of assignments and added to a first list comprising pins to be fixed on integration unit level, and pins with a late mode slack not higher than said second threshold value are assigned to said third category of assignments.

7. The method according to claim 6, wherein for each pin of said third category of assignments an integration unit net name is parsed for at least one delay device or buffer, wherein a corresponding pin connected to at least one delay device or buffer is added to a second list comprising fixable pins to be fixed on integration unit level.

8. The method according to claim 7, wherein each pin of said third category of assignments not connected to at least one delay device or buffer or pin of said first category of assignments is applied to an expert system.

9. The method according to claim 8, wherein said expert system determines a source macro location as an early mode slack fix location if a difference between a source weight value and a sink weight value is higher than a certain threshold value.

10. The method according to claim 8, wherein said expert system determines a sink macro location as an early mode slack fix location if a difference between said sink weight value and said source weight value is higher than a certain threshold value.

11. The method according to claim 8, wherein said expert system determines that there is no early mode slack fix location if said difference between said source weight value and said sink weight value and said difference between said sink weight value and said source weight value are not higher than said certain threshold value.

12. The method according to claim 8, wherein said expert system outputs:
fixable pins to be fixed in said source macro and to be added to a third list comprising fixable pins to be fixed in said source macro,
fixable pins to be fixed in said sink macro and to be added to a fourth list comprising fixable pins to be fixed in said sink macro,
critical pins to be fixed in said source macro and to be added to a fifth list comprising critical pins to be fixed in said source macro,
fixable pins to be fixed at unit level and to be added to said second list comprising fixable pins to be fixed on integration unit level,
critical pins to be fixed in said sink macro and to be added to a sixth list comprising critical pins to be fixed in said sink macro, and
critical pins for which a fix has not been determined and are to be added to a seventh list comprising critical pins for which a fix has not been determined.

13. The method according to claim 12, wherein for each pin of said third and fifth list a corresponding source macro output pin is determined and listed in addition to said actually analyzed input pin of said sink macro.

14. The method according to claim 13, wherein for each source macro output pin to be fixed an existing timing contract is maintained.

* * * * *